(12) United States Patent
Chan et al.

(10) Patent No.: US 12,074,107 B2
(45) Date of Patent: Aug. 27, 2024

(54) STRUCTURE AND METHOD OF FORMING A SEMICONDUCTOR DEVICE WITH RESISTIVE ELEMENTS

(71) Applicant: Taiwan Semiconductor Manufacturing Co., Ltd., Hsinchu (TW)

(72) Inventors: Hong-Wei Chan, Hsinchu (TW); Yung-Shih Cheng, Hsinchu (TW); Wen-Sheh Huang, Hsin Chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/813,880

(22) Filed: Jul. 20, 2022

(65) Prior Publication Data

US 2022/0359387 A1 Nov. 10, 2022

Related U.S. Application Data

(62) Division of application No. 17/111,417, filed on Dec. 3, 2020, now Pat. No. 11,437,313.

(60) Provisional application No. 62/978,738, filed on Feb. 19, 2020.

(51) Int. Cl.
*H01L 23/522* (2006.01)
*H01L 21/762* (2006.01)
*H01L 21/768* (2006.01)
*H01L 49/02* (2006.01)

(52) U.S. Cl.
CPC ........ *H01L 23/5228* (2013.01); *H01L 21/762* (2013.01); *H01L 21/76877* (2013.01); *H01L 23/5226* (2013.01); *H01L 28/20* (2013.01)

(58) Field of Classification Search
CPC ............. H01L 27/3276; H01L 27/3279; H01L 27/3288; H01L 27/762; H01L 28/20; H01L 23/5228; H01L 21/76877
See application file for complete search history.

(56) References Cited

U.S. PATENT DOCUMENTS

| 7,217,982 | B2 | 5/2007 | Taylor et al. |
| 7,897,505 | B2 | 3/2011 | Ko et al. |
| 8,563,336 | B2 | 10/2013 | Chen et al. |
| 9,093,455 | B2 | 7/2015 | Liou et al. |
| 9,130,022 | B2 | 9/2015 | Wu et al. |

(Continued)

FOREIGN PATENT DOCUMENTS

CN 108364937 A 8/2018

*Primary Examiner* — Jaehwan Oh
*Assistant Examiner* — John M Parker
(74) *Attorney, Agent, or Firm* — Haynes and Boone, LLP

(57) ABSTRACT

A method of forming a semiconductor device includes forming a conductive feature and a first punch stop layer, where the conductive feature has a first top surface, and where the first punch stop layer has a second top surface that is substantially level with the first top surface. The method further includes forming a resistive element over the first punch stop layer. The method further includes etching through a first portion of the resistive element to form a first trench that exposes both the second top surface of the first punch stop layer and a first sidewall surface of the resistive element. The method further includes forming a first conductive via within the first trench, where the first conductive via contacts the first sidewall surface of the resistive element.

20 Claims, 11 Drawing Sheets

(56) References Cited

U.S. PATENT DOCUMENTS

| | | |
|---|---|---|
| 9,343,356 B2 | 5/2016 | Kuo et al. |
| 9,412,866 B2 | 8/2016 | Kuoh et al. |
| 9,870,944 B2 | 1/2018 | Liou et al. |
| 10,515,902 B2 | 12/2019 | Chiang et al. |
| 2002/0113317 A1* | 8/2002 | Okushima ......... H01L 21/76849 257/E21.585 |
| 2007/0040239 A1 | 2/2007 | Chinthakindi et al. |
| 2015/0162396 A1 | 6/2015 | Yagi et al. |
| 2019/0139754 A1 | 5/2019 | Hsueh et al. |
| 2019/0139826 A1 | 5/2019 | Huang et al. |

* cited by examiner

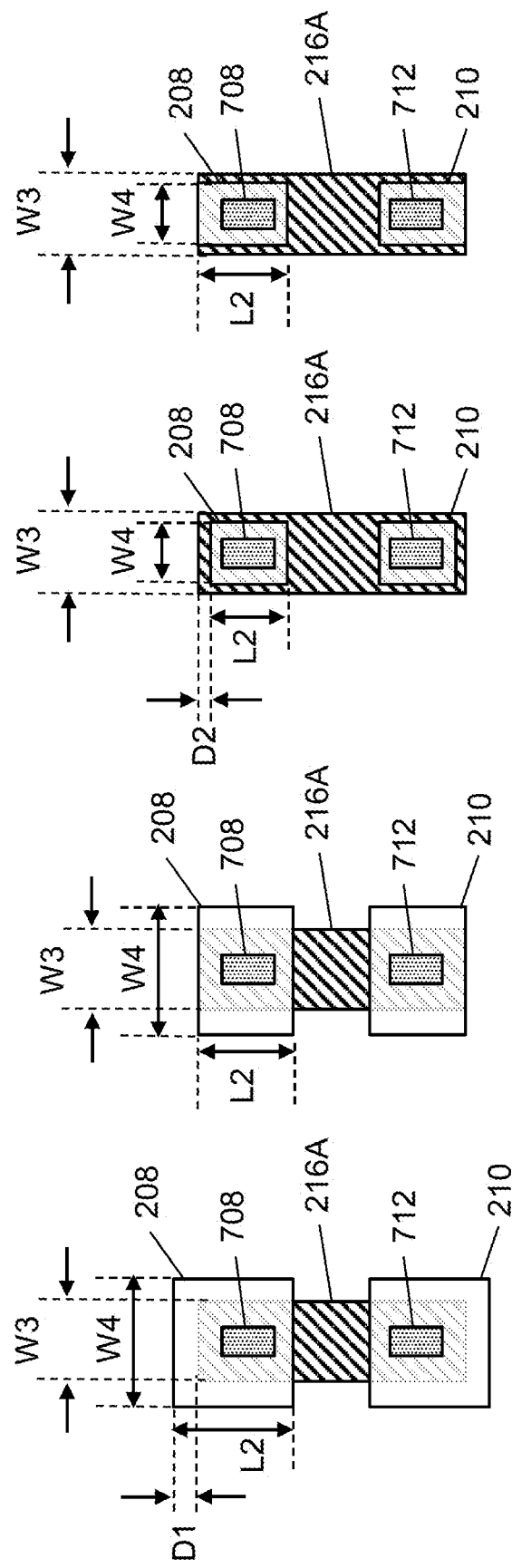

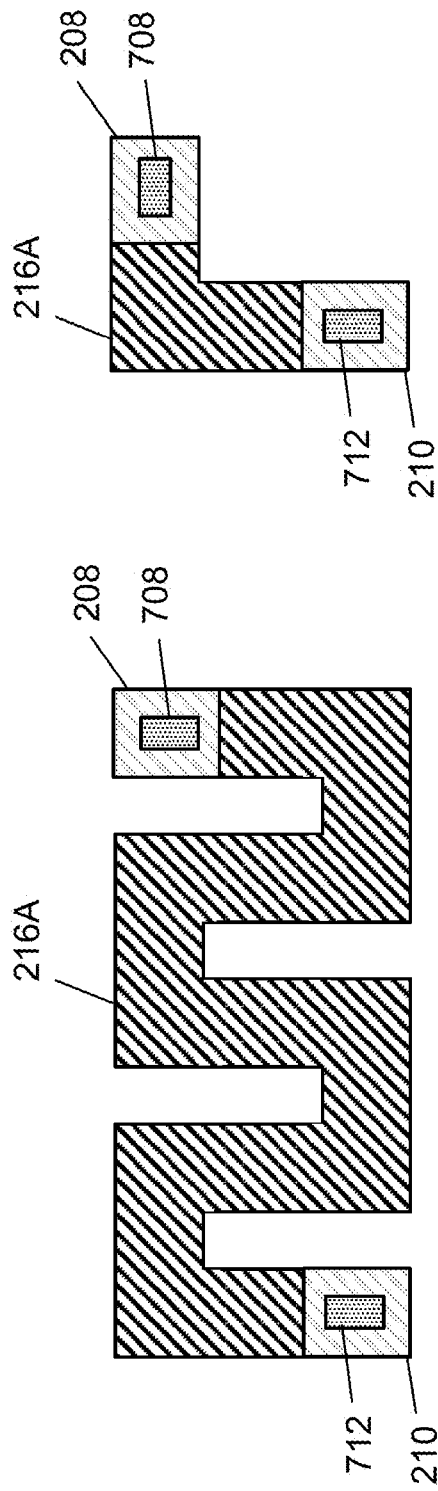

STRUCTURE AND METHOD OF FORMING A SEMICONDUCTOR DEVICE WITH RESISTIVE ELEMENTS

CROSS-REFERENCE TO RELATED APPLICATION

This application is a divisional of U.S. patent application Ser. No. 17/111,417, filed Dec. 3, 2020, which claims the benefit of U.S. Provisional Application No. 62/978,738, filed Feb. 19, 2020, the entireties of which are incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. As a result, the challenge of fabricating reliable electronic devices has increased.

Thus, the realization of continued advances in semiconductor ICs and devices calls for similar advances in semiconductor manufacturing processes and technology. However, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10, 11, 12, and 13 are top-views of a resistor region of a semiconductor device with alternative punch stop layer (PSL) dimensions, according to some embodiments;

FIGS. 14 and 15 are top-views of a resistor region of a semiconductor device with alternative resistive element geometries, according to some embodiments.

DETAILED DESCRIPTION

Figure 1:
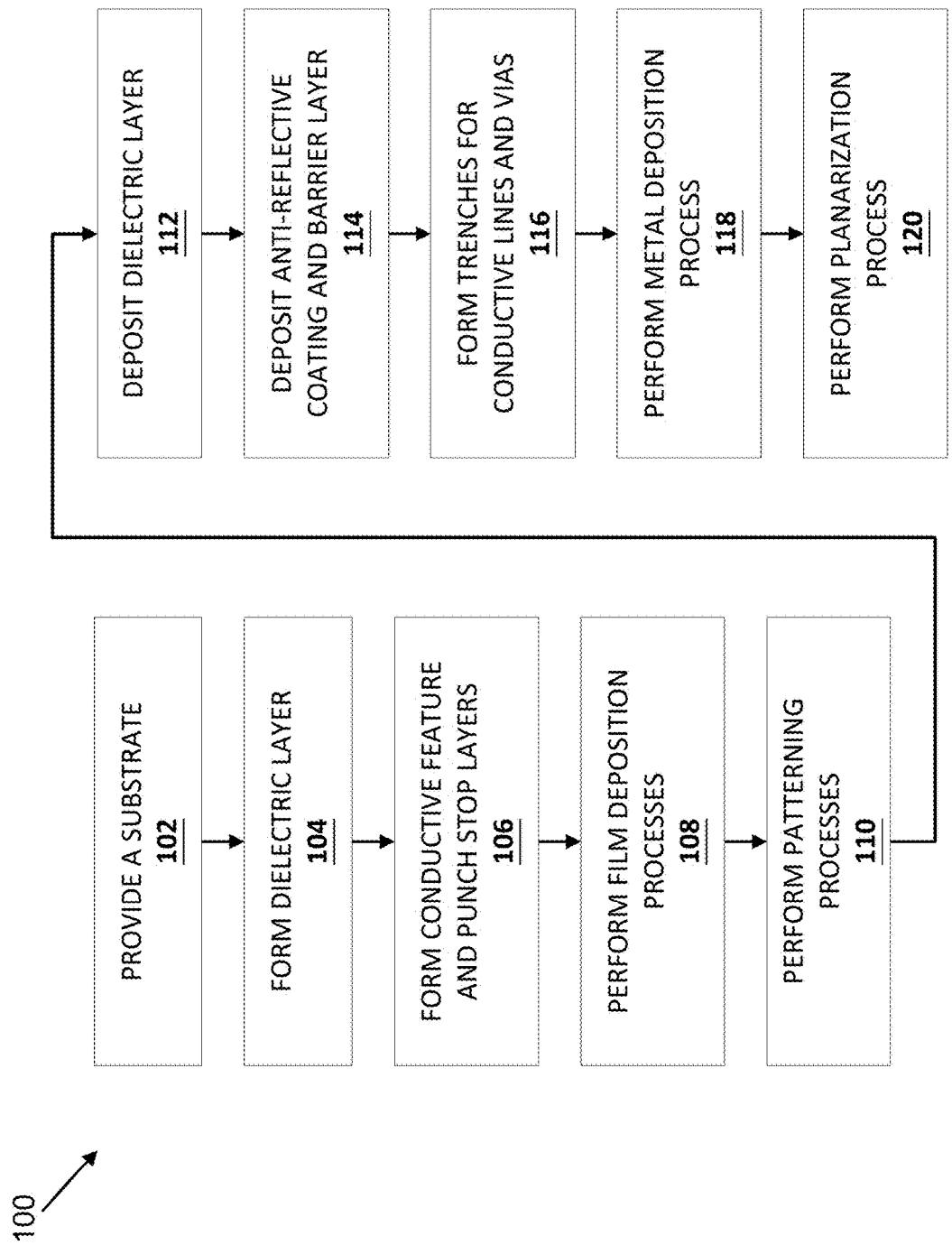
FIG. 1 is a flow chart of a method of fabricating a semiconductor device including a resistive element, according to one or more aspects of the present disclosure.
Figure 2:
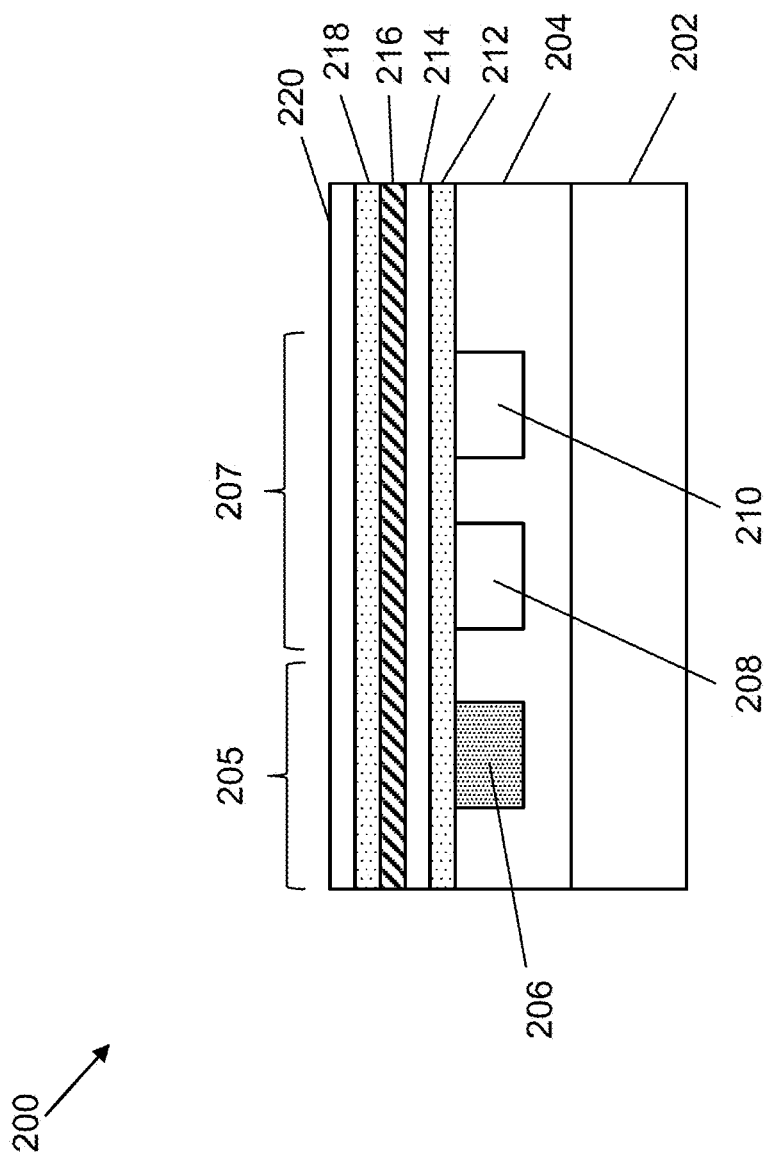
FIGS. 2, 3, 4, 5, 6, and 7 are cross-section views of an embodiment of a semiconductor device 200 according to various stages of the method of FIG. 1.
Figure 3:
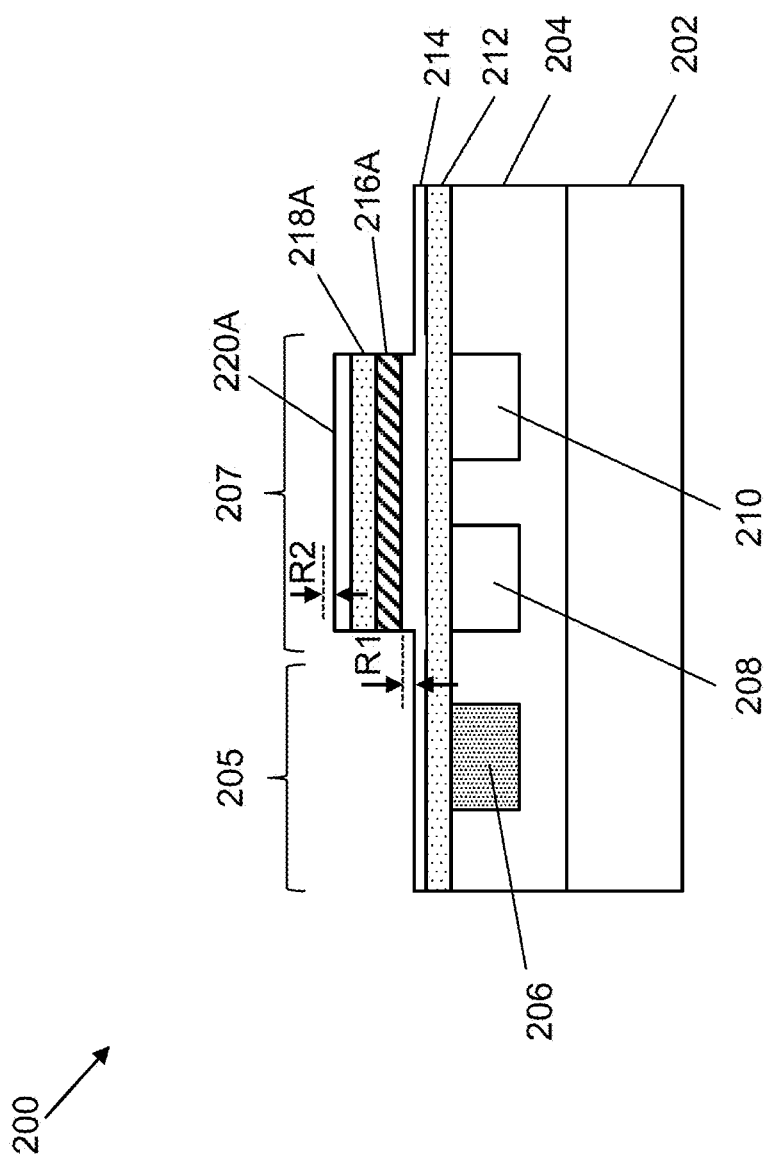
Figure 4:
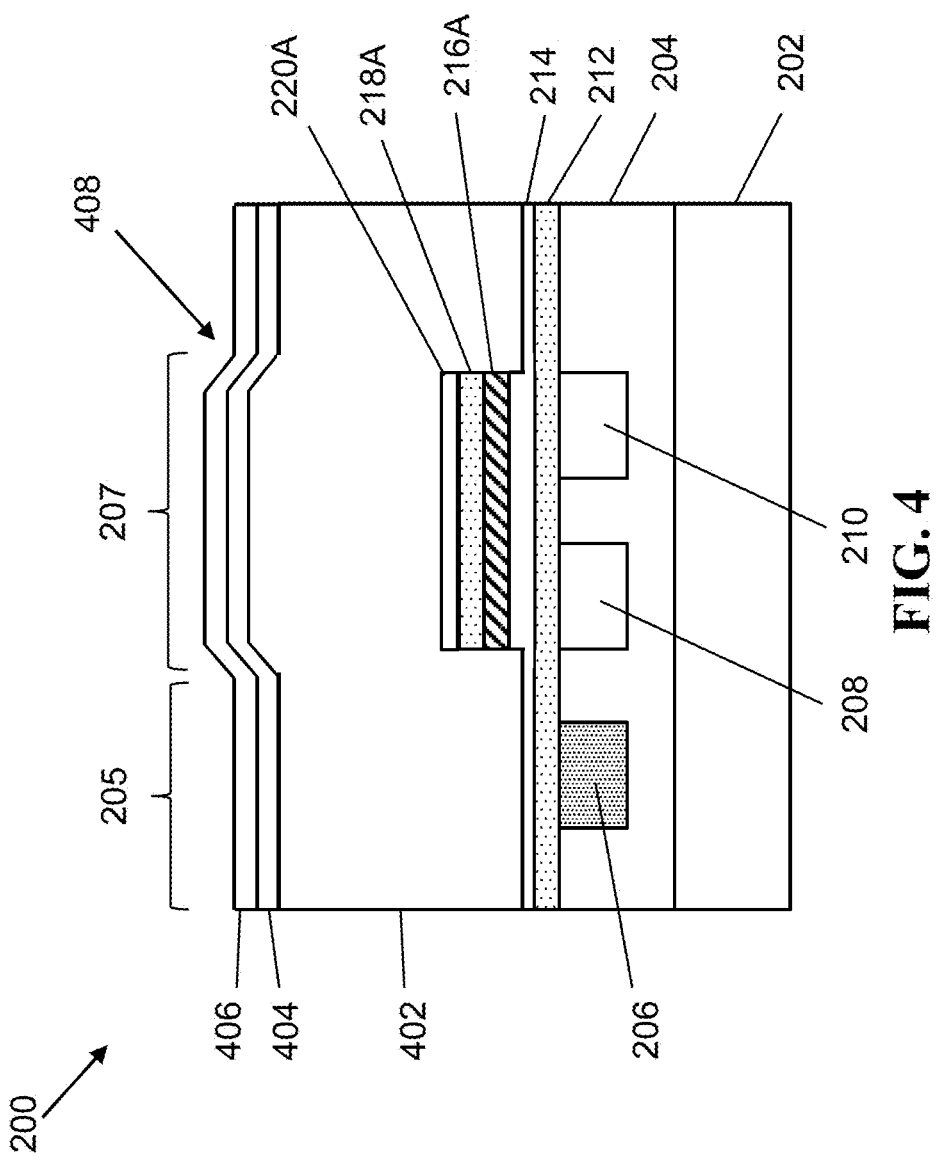
Figure 5:
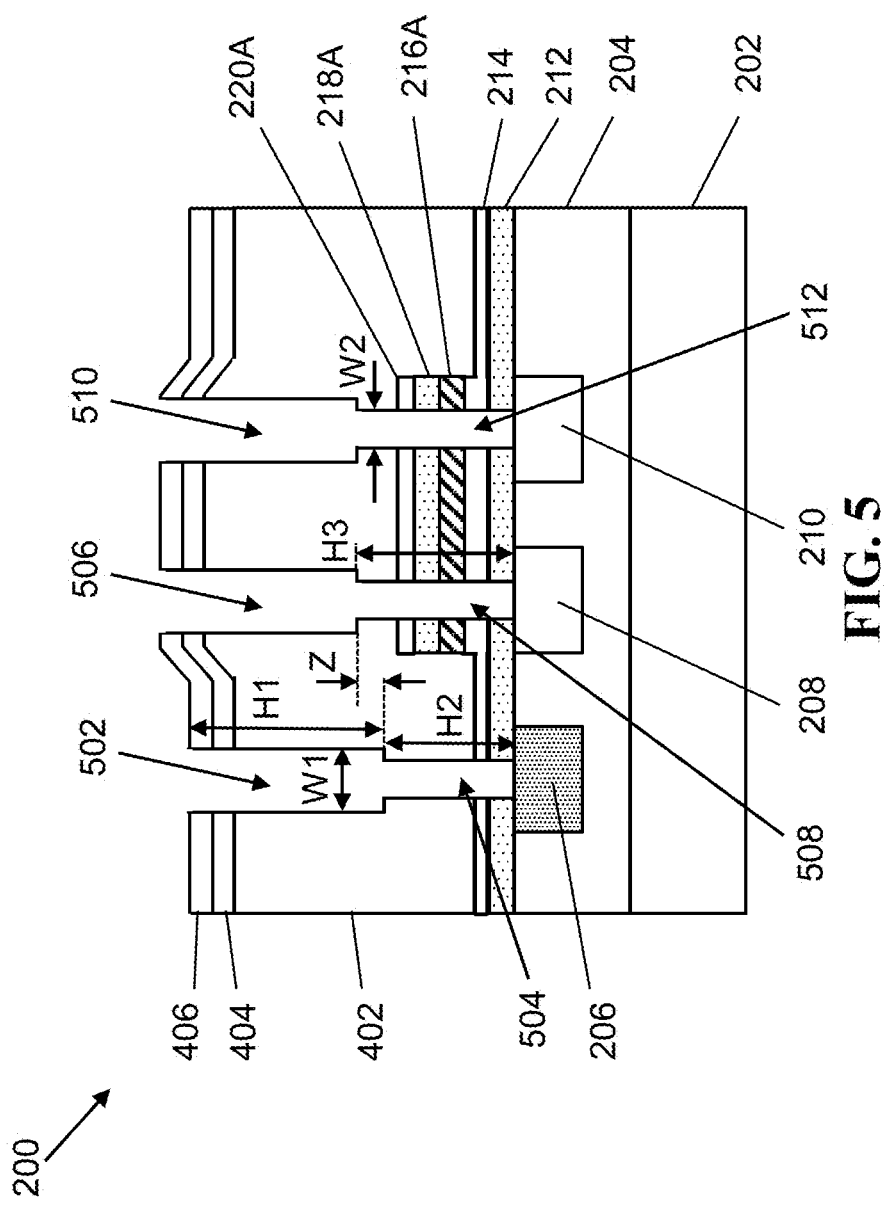
Figure 6:
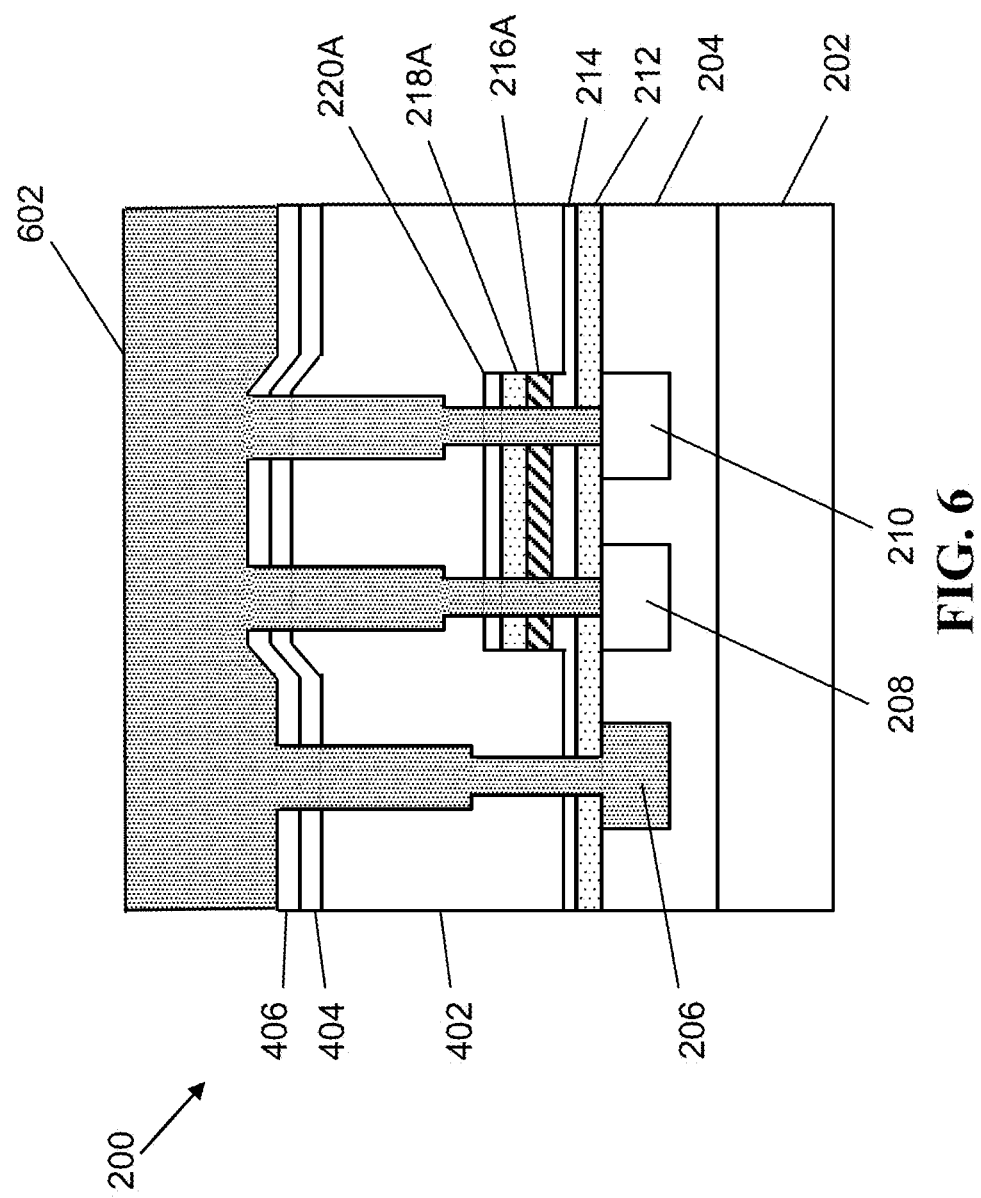

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally directed to a structure and related method of forming a semiconductor device including a resistive element, where the resistive element functions as a resistor. In some cases, the resistive element may be formed as part of a back-end-of line (BEOL) process, for example, between metal layers of a multilayer metal interconnect structure. The multilayer metal interconnect structure may be used to interconnect various front-end-of line (FEOL) devices (e.g., such as transistors) to each other and to the resistive element to form integrated circuits including the resistive element. In some examples, the resistive elements disclosed herein may be formed as part of an analog circuit. However, the disclosed resistive elements may be generally applicable to any type of circuit using resistors.

In at least some existing implementations, resistor uniformity (including both their fabrication and resistance values) are getting worse as resistor dimensions decrease. For instance, in a BEOL process, an electrical connection to a resistive element may be made using a metal interconnect layer coupled to a conductive via, where the conductive via is in contact with the resistive element. However, in at least some existing implementations, the conductive via contacting the resistive element extends into the resistive element (e.g., by about 10-40 Angstroms) and terminates within the resistive element. Moreover, an amount by which the conductive via extends into the resistive element may vary from conductive via-to-conductive via, for example, depending on a via etch process used to form via recesses within which the conductive via is formed. This phenomenon may be referred to as recess depth variation, and such variations will have a direct impact on resistor uniformity (e.g., including resistance values). These variations will degrade device and circuit performance and reliability. In addition, the challenge of recess depth variations is expected to increase with the continued scaling down of resistor dimensions. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include a structure and related method of forming a semiconductor device including a resistive element with enhanced uniformity. In various examples, and to address the recess depth variation issue present in some existing implementations, embodiments of the present disclosure provide a punch stop layer (PSL) disposed beneath the resistive element and directly beneath a conductive via that is used to contact the resistive element. In various embodiments, and as described in more detail below, the conductive via may punch through the resistive element (and one or more other layers) and stop on the PSL. Thus, rather than having the conductive via terminate at some uncertain and varying position within the resistive element, the conductive vias used to contact the resistive elements may pass entirely through the respective resistive element to which they are in contact and stop on an underlying PSL. As a result, the via recess depth variation issue may be ignored, while simultaneously improving the resistor uniformity, especially for highly scaled resistor dimensions. Other embodiments and advantages will be evident to those skilled in the art upon reading the present disclosure.

Illustrated in FIG. 1 is a method 100 of fabricating a resistive element with enhanced uniformity, in accordance with various embodiments. The method 100 is described with reference to FIGS. 2-7, which provide cross-section views of an embodiment of a semiconductor device 200 according to various stages of the method 100 of FIG. 1. It is understood that the method 100 includes steps having features of a complementary metal-oxide-semiconductor (CMOS) technology process flow and thus, are only described briefly herein. Also, additional steps may be performed before, after, and/or during the method 100. Moreover, it is noted that the process steps of the method 100, including any descriptions given with reference to the figures are merely exemplary and are not intended to be limiting beyond what is specifically recited in the claims that follow.

The method 100 begins at block 102 where a substrate is provided. Referring to the example of FIG. 2, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

In some embodiments, various device elements are formed in and/or on the substrate 202. Examples of the various device elements that may be formed in and/or on the semiconductor substrate 202 include metal-oxide-semiconductor field-effect transistors (MOSFETs), complementary metal-oxide-semiconductor (CMOS) transistors, bipolar junction transistors (BJTs), high-voltage transistors, high-frequency transistors, P-channel and/or N-channel field-effect transistors (PFETs, NFETs), diodes, other suitable elements, or combinations thereof. In some examples, the various device elements include FEOL devices, as discussed above. Various processes may be performed to form the various device elements, such as deposition, etching, implantation, photolithography, annealing, planarization, one or more other applicable processes, or a combination thereof. In addition, and in some embodiments, isolation features may be formed within the substrate 202 to define and isolate the various device elements formed in and/or on the substrate 202. The isolation features include, for example, shallow trench isolation (STI) features or local oxidation of silicon (LOCOS) features.

The method proceeds to block 104 where a dielectric layer is formed. In some embodiments, the dielectric layer includes an inter-layer dielectric (ILD) layer. Still referring to the example of FIG. 2, in an embodiment of block 104, a dielectric layer 204 is formed over the device 200. In some embodiments, the dielectric layer 204 includes materials such as tetraethylorthosilicate (TEOS) oxide, a carbon-containing silicon oxide, silicon oxide, a porous dielectric material, un-doped silicate glass, or doped silicon oxide such as borophosphosilicate glass (BPSG), fluorinated silicate glass (FSG), phosphosilicate glass (PSG), borosilicate glass (BSG), another suitable low-K or extra low-K dielectric material, one or more other suitable dielectric materials, or a combination thereof.

The method proceeds to block 106 where a conductive feature and punch stop layers (PSL) are formed. Referring to the example of FIG. 2, in an embodiment of block 106, a conductive feature 206 and punch stop layers (PSLs) 208, 210 are formed within the dielectric layer 204. The conductive feature 206 includes a conductive line that provides a portion of a metal interconnect structure that may include other conductive lines, as well as conductive vias. In various embodiments, the PSLs 208, 210 are not part of the metal interconnect structure (e.g., and may not be electrically active), but instead provide an etch stop layer (e.g., for a via etch process) beneath the resistive element and directly beneath conductive vias used to contact the resistive element, where such conductive vias may punch through the resistive element (and one or more other layers) and stop on the PSLs 208, 210. The conductive feature 206 may be formed in a logic region 205 of the device 200, and the PSLs 208, 210 may be formed in a resistor region 207 of the device 200. In some cases, trenches may initially be formed within the dielectric layer 204 using a combination of photolithography and etching processes. The trenches may define regions within each of the logic region 205 and the resistor region 207 where the conductive feature 206 and the PSLs 208, 210, respectively, will be formed.

In some embodiments, the trench in the logic region 205 may be filled with a conductive material such as copper, cobalt, tungsten, titanium, nickel, gold, platinum, silicide, another suitable conductive material, or a combination thereof. The conductive material used to fill the trench in the logic region 205 may be deposited using a CVD process, an ALD process, a PVD process, an electroplating process, an electroless plating process, one or more other applicable processes, or a combination thereof. The trenches in the resistor region 207 may be filled with a conductive material such as aluminum, copper, other suitable metal materials, or a combination thereof. In some examples, the trenches in the resistor region 207 may alternatively be filled with cobalt, tungsten, titanium, nickel, gold, platinum, silicide, other suitable metal materials, or a combination thereof. The conductive material used to fill the trenches in the resistor region 207 may be deposited using a CVD process, an ALD process, a PVD process, an electroplating process, an electroless plating process, one or more other applicable processes, or a combination thereof.

After filling the trenches in each of the logic region 205 and the resistor region 207 with the appropriate conductive material, a chemical mechanical polishing (CMP) process (planarization process) may be performed to remove excess conductive material from outside of the trenches. Thus, the remaining portions of the conductive material in trenches form the conductive feature 206 (in the logic region 205) and the PSLs 208, 210 (in the resistor region 207). After the planarization process, top surfaces of the conductive feature 206, the PSLs 208, 210, and the dielectric layer 204 may be substantially coplanar (level). It is noted that in various embodiments, the conductive feature 206 and the PSLs 208, 210 may be formed at the same time. Thus, in some examples, the formation process of the PSLs 208, 210 may be substantially the same as the formation process used for the conductive feature 206, as described above. In at least one example, a thickness of the PSLs 208, 210 may be substantially the same as a thickness of the conductive feature 206, as the trenches used to define the regions within which the conductive feature 206 and the PSLs 208, 210 will be formed may be fabricated at the same time and by the same process. Other dimensions (e.g., such as the top view area) of the PSLs 208, 210 will depend on the top view area of a subsequently formed resistive element, as described in more detail below. In some embodiments, the conductive feature 206 includes one of the third to the seventh level metal lines of a back-end multilayer metal interconnect structure. Also, it will be understood that while a single conductive feature 206 has been shown, more conductive features may be used without departing from the scope of this disclosure. Similarly, while two PSLs 208, 210 have been shown, it will be understood that more or less PSLs may be used without departing from the scope of this disclosure. Further, in various embodiments, the formation of each of the conductive feature 206 and the PSLs 208, 210 (e.g., including one or more of patterning and etching of trenches, filling with conductive material, and planarization) may be performed simultaneously, or may be performed separately for each of the conductive feature 206 and the PSLs 208, 210. For example, in some cases, if the material used for each of the conductive feature 206 and the PSLs 208, 210 is the same, then formation of the conductive feature 206 and the PSLs 208, 210 may be performed simultaneously. In other examples, if the material used for each of the conductive feature 206 and the PSLs 208, 210 is different, then formation of the conductive feature 206 and the PSLs 208, 210 may be performed separately.

In some embodiments, a barrier layer may also be formed between the conductive feature 206 and the dielectric layer 204, and/or between the PSLs 208, 210 and the dielectric layer 204, to prevent diffusion of the conductive material used to form the conductive feature 206 and the PSLs 208, 210. For example, the barrier layer may be deposited on sidewall and bottom surfaces of the trenches in the logic region 205 and the resistor region 207 prior to deposition of the conductive material used to form the conductive feature 206 and the PSLs 208, 210. Such a barrier layer, if present, may include tantalum nitride, titanium nitride, one or more other suitable materials, or a combination thereof.

As previously noted, the conductive feature 206 includes a conductive line that provides a portion of a metal interconnect structure that may include other conductive lines, as well as conductive vias. The various device elements formed in and/or on the substrate 202, as discussed above, will be interconnected through the multilayer metal interconnect structure formed over the semiconductor substrate 202. As a result, integrated circuit devices are formed. The integrated circuit devices may include logic devices, memory devices (e.g., DRAMs, SRAMs), radio frequency (RF) devices, input/output (I/O) devices, system-on-chip (SoC) devices, image sensor devices, one or more other applicable types of devices, or a combination thereof. In addition to interconnecting the various FEOL devices, the multilayer metal interconnect structure may be used to connect one or more resistive elements to each other and/or to the various FEOL devices, to form integrated circuits including the one or more resistive elements.

The method proceeds to block 108 where film deposition processes are performed. Once again with reference to the example of FIG. 2, in an embodiment of block 108, one or more layers (including a resistive layer) is deposited over the device 200, including over the dielectric layer 204, the conductive feature 206, and the PSLs 208, 210. For instance, a first barrier layer 212 may be deposited over the device 200, including over the dielectric layer 204, the conductive feature 206, and the PSLs 208, 210. In some embodiments, the first barrier layer 212 is made of a different material than the dielectric layer 204. The first barrier layer 212 may include silicon carbide (SiC), nitrogen-doped SiC, oxygen-doped SiC, silicon nitride (SiN), silicon oxynitride (SiON), silicon oxide, one or more other suitable materials, or a combination thereof. The first barrier layer 212 may be deposited using a CVD process, an ALD process, a PVD process, one or more other applicable processes, or a combination thereof. In some embodiments, a dielectric layer 214 may be formed over the first barrier layer 212. In some cases, the dielectric layer 214 may include a tetraethylorthosilicate (TEOS) oxide layer. In addition, or alternatively, the dielectric layer 214 may include a carbon-containing silicon oxide, silicon oxide, a porous dielectric material, un-doped silicate glass, or doped silicon oxide such as BPSG, FSG, PSG, BSG, another suitable low-K or extra low-K dielectric material, one or more other suitable dielectric materials, or a combination thereof. The dielectric layer 214 may be deposited using a CVD process, an ALD process, a PVD process, one or more other applicable processes, or a combination thereof.

After formation of the dielectric layer 214, and in various embodiments, a resistive layer 216 is deposited over the dielectric layer 214. In some embodiments, the resistive layer 216 includes tantalum nitride (TaN), titanium nitride (TiN), amorphous silicon, one or more other suitable materials, or a combination thereof. More generally, and in some embodiments, the resistive layer 216 is made of a nitrogen-containing material. In some examples, the atomic concentration of nitrogen of the resistive layer 216 is in a range from about 40% to about 70%. In some embodiments, the resistive layer 216 is deposited using a CVD process, an ALD process, a PVD process, one or more other applicable processes, or a combination thereof. The resistive layer 216 may be patterned to subsequently form a resistive element, as discussed in more detail below.

In some embodiments, the resistive layer 216 is thinner than the conductive feature 206. The ratio of the thickness of the resistive layer 216 to the thickness of the conductive feature 206 may be in a range from about 1/20 to about 1/15. In some cases, if the ratio is greater than about 1/15, the resistive layer 216 might have a resistance that is not high enough for some applications. In some other cases, if the ratio is smaller than about 1/20, the quality or reliability of the resistive layer 216 might need to be improved for some applications. Merely by way of example, and in some embodiments, the thickness of the resistive layer 216 may be equal to about 45 Angstroms. More generally, and in some embodiments, the thickness of the resistive layer 216 may be in a range from about 40-70 Angstroms, for example, to provide a target sheet resistance (resistivity/thickness). In some examples, if the thickness of the resistive layer 216 is greater than about 70 Angstroms, the resistive layer 216 may have a resistance that is too low to meet the target sheet resistance. Alternatively, in some cases, if the thickness of the resistive layer 216 is less than about 40 Angstroms, the quality or reliability of the resistive layer 216 may not be adequate for some applications. In general, as the thickness of the resistive layer 216 decreases, the resistance value of the resistive layer 216 increases. In some embodiments, the target sheet resistance of the resistive layer 216 is in a range of about 500-900 Ohms-per-square.

After forming the resistive layer 216, and in some embodiments, a second barrier layer 218 may be deposited over the resistive layer 216. In some embodiments, the second barrier layer 218 is made of the same material as the first barrier layer 212. However, in some cases, the second barrier layer 218 may be made of a different material than the first barrier layer 212. The second barrier layer 218, like the first barrier layer 212, may include SiC, nitrogen-doped SiC, oxygen-doped SiC, SiN, SiON, silicon oxide, one or more other suitable materials, or a combination thereof. The second barrier layer 218 may be deposited using a CVD process, an ALD process, a PVD process, one or more other applicable processes, or a combination thereof. In some embodiments, a dielectric layer 220 may be formed over the second barrier layer 218. In some examples, the dielectric layer 220 may be made of the same material as the dielectric layer 214. However, in some cases, the dielectric layer 220 is made of a different material than the dielectric layer 214. The dielectric layer 220, like the dielectric layer 214, may include a TEOS oxide layer. In addition, or alternatively, the dielectric layer 220 may include a carbon-containing silicon oxide, silicon oxide, a porous dielectric material, un-doped silicate glass, or doped silicon oxide such as BPSG, FSG, PSG, BSG, another suitable low-K or extra low-K dielectric material, one or more other suitable dielectric materials, or a combination thereof. The dielectric layer 220 may be deposited using a CVD process, an ALD process, a PVD process, one or more other applicable processes, or a combination thereof.

In some embodiments, the thickness of the first barrier layer 212 and the second barrier layer 218 is substantially the same. Thus, in various embodiments, the ratio of the thickness of the first barrier layer 212 to the thickness of the second barrier layer 218 may be in a range of between about 0.9 and 1.1. As merely one example, the thickness of the first barrier layer 212 and the second barrier layer 218 may be in a range between about 90-110 Angstroms (e.g., such as about 100 Angstroms). In some examples, if the thickness of the first barrier layer 212 or the thickness of second barrier layer 218 is less than about 90 Angstroms, excess silicide may be formed during a subsequent formation of conductive contact features (e.g., block 118 of the method 100) causing an increase in leakage current and degrading device performance. In some cases, if the thickness of the first barrier layer 212 of the thickness of the second barrier layer 218 is greater than about 110 Angstroms, it may be difficult to control an etching depth for a subsequent via etching process (e.g., block 116 of the method 100). Likewise, in some embodiments, if the ratio of the thickness of the first barrier layer 212 to the thickness of the second barrier layer 218 falls outside of the range between about 0.9 and 1.1, then the etching depth for the subsequent via etching process may again be difficult to control (e.g., block 116 of the method 100).

In some cases, the thickness of the dielectric layer 220 is greater than the thickness of the dielectric layer 214. In some embodiments, the thickness of the dielectric layer 220 may be greater than the thickness of the dielectric layer 214 to provide protection from the greater recessing that occurs to the dielectric layer 220 (as compared to the dielectric layer 214) during an etching process of a subsequent patterning step (block 110), as described below. After the film deposition processes, and prior to subsequent patterning processes, the ratio of the thickness of the dielectric layer 220 to the thickness of the dielectric layer 214 may be in a range of between about 1.4 and 1.6. In some cases, if the ratio of the thickness of the dielectric layer 220 to the thickness of the dielectric layer 214 falls outside of the range between about 1.4 and 1.6, then the etching depth for the subsequent via etching process (e.g., block 116 of the method 100) may be difficult to control and/or the dielectric layer 220 or the dielectric layer 214 may not provide adequate electrical isolation or adequate protection from stress imposed by neighboring layers, which may damage the resistive layer 216. Further, if the dielectric layer 220 is too thin, the dielectric layer 220 may be unintentionally completed consumed during the etching process of the subsequent patterning step (block 110), and the resistive layer 216 may be damaged. In an example, the thickness of the dielectric layer 220 may be in a range between about 270-330 Angstroms (e.g., such as about 300 Angstroms), and the thickness of the dielectric layer 214 may be in a range between about 180-220 Angstroms (e.g., such as about 200 Angstroms).

With respect to the resistive layer 216, and in some embodiments, the ratio of the thickness of the resistive layer 216 to the thickness of the first barrier layer 212 (or to the second barrier layer 218) may be in a range of between about 0.4 and 0.5. In some embodiments, after the film deposition processes and prior to subsequent patterning processes, the ratio of the thickness of the resistive layer 216 to the thickness of the dielectric layer 220 may be in a range of between about 0.1 and 0.2. In some examples, after the film deposition processes and prior to subsequent patterning processes, the ratio of the thickness of the resistive layer 216 to the thickness of the dielectric layer 214 may be in a range of between about 0.2 and 0.3. In various embodiments, if the thickness ratios of the resistive layer 216 to each of the other layers (e.g., such as the first barrier layer 212, the second barrier layer 218, the dielectric layer 220, and the dielectric layer 214) fall outside of the ranges noted above, the etching depth for the subsequent via etching process (e.g., block 116 of the method 100) may again be difficult to control, the resistance of the resistive layer may be too low to meet the target sheet resistance (e.g., if the resistive layer 216 is too thick), or the quality or reliability of the resistive layer (or one or more of the other adjacent layer) may not be adequate for some applications (e.g., if the resistive layer 216 or adjacent layers are too thin). Also, as noted above, the first barrier layer 212 and the second barrier layer 218 may be formed, in various embodiments, in order to reduce the formation of excess silicide during a subsequent formation of conductive contact features, which may be useful in reducing leakage current through a path provided by the excess silicide, thereby improving device performance.

The method proceeds to block 110 where a patterning process is performed. With reference to the example of FIGS. 2 and 3, in an embodiment of block 110, a patterning process is performed to provide a resistive element 216A.

The formation of the resistive element 216A may include a suitable combination of photolithography and etching processes. For example, a photoresist (resist) layer may be deposited over the dielectric layer 220 and patterned, using a photolithography process, to provide a patterned resist layer that will define a desired geometry (e.g., top-view shape) of the resistive element 216A. The top view of the resistive element 216A may have any suitable shape. For example, the top view of the resistive element 216A has a rectangular shape or a square shape. After forming the patterned resist layer, an etching process (e.g., dry etching, wet etching, or a combination thereof) is performed. In some embodiments, the etching process removes portions of the dielectric layer 220, the second barrier layer 218, and the resistive layer 216 that are unprotected by patterned resist layer (e.g., portions outside the resistor region 207) to provide a patterned dielectric layer 220A, a patterned second barrier layer 218A, and the resistive element 216A. In some embodiments, the etching process may also partially recess exposed portions of the dielectric layer 214, as shown. In some embodiments, the etching process may recess the dielectric layer 214 by a recess depth 'R1' in regions that are unprotected by patterned resist layer (e.g., portions outside the resistor region 207 such as within the logic region 205). In some cases, the recess depth 'R1' is in a range between about 90-110 Angstroms (e.g., such as about 100 Angstroms). It is also noted that, in some embodiments, the etching process may consume the patterned resist layer (e.g., within the resistor region 207) and partially recess the patterned dielectric layer 220A by a recess depth 'R2' such that a thickness of the patterned dielectric layer 220A is less than the thickness of the dielectric layer 220 prior to the etching process. In some cases, the recess depth 'R2' is in a range between about 180-220 Angstroms (e.g., such as about 200 Angstroms). In addition, and in various embodiments, the dielectric layer 214 and the first barrier layer 212 may serve to protect the dielectric layer 204, the conductive feature 206, and the PSLs 208, 210 during the patterning process of block 110 to form the resistive element 216A.

After the patterning process of block 110, including after the recessing of the dielectric layer 214 (in the logic region 205) and the recessing of the dielectric layer 220A (in the resistor region 207), some of the thickness ratios will be different than the ranges previously noted (e.g., prior to the patterning process). For example, after the patterning process (block 110), the ratio of the thickness of the dielectric layer 220A to the thickness of the dielectric layer 214 (within the logic region 205) may be in a range of between about 0.9 and 1.1. In other words, after the patterning process, the thickness of the dielectric layer 220A and the thickness of the dielectric layer 214 (within the logic region 205) may be substantially the same. In some examples, and after the patterning process (block 110), the thickness of the dielectric layer 220A and the dielectric layer 214 (within the logic region 205) may be in a range between about 90-110 Angstroms (e.g., such as about 100 Angstroms). As a further example, and again after the patterning process (block 110), the ratio of the thickness of the dielectric layer 220A to the thickness of the dielectric layer 214 (within the resistor region 207) may be in a range of between about 0.4 and 0.6. In other words, after the patterning process, the thickness of the dielectric layer 220A may be about half as thick as the dielectric layer 214 (within the resistor region 207). In some examples, and after the patterning process (block 110), the thickness of the dielectric layer 220A may be in a range between about 90-110 Angstroms (e.g., such as about 100 Angstroms, and the thickness of the dielectric layer 214 (within the resistor region 207) may be in a range between about 180-220 Angstroms (e.g., such as about 200 Angstroms). In some cases, if the ratio of the thickness of the dielectric layer 220A to the thickness of the dielectric layer 214 (within the resistor region 207) falls outside of the range between about 0.4 and 0.6, then the etching depth for the subsequent via etching process (e.g., block 116 of the method 100) may be difficult to control and/or the dielectric layer 220A or the dielectric layer 214 may not provide adequate electrical isolation or adequate protection from stress imposed by neighboring layers, which may damage the resistive layer 216A. Additionally, after the patterning process (block 110) and in some embodiments, the ratio of the thickness of the resistive layer 216A to the thickness of the dielectric layer 220A may be in a range of between about 0.4 and 0.5. In some embodiments, if the thickness ratio of the resistive layer 216A to the dielectric layer 220A falls outside of the noted range (after the patterning process), the etching depth for the subsequent via etching process (e.g., block 116 of the method 100) may again be difficult to control, the resistance of the resistive layer may be too low to meet the target sheet resistance (e.g., if the resistive layer 216 is too thick), or the quality or reliability of the resistive layer and/or the dielectric layer 220A may not be adequate for some applications (e.g., if the resistive layer 216 and/or the dielectric layer 220A are too thin).

The method proceeds to block 112 where a dielectric layer is deposited. With reference to the example of FIGS. 3 and 4, in an embodiment of block 112, a dielectric layer 402 is deposited over the device 200. In some embodiments, the dielectric layer 402 includes TEOS oxide, a carbon-containing silicon oxide, silicon oxide, a porous dielectric material, un-doped silicate glass, or doped silicon oxide such as BPSG, FSG, PSG, BSG, another suitable low-K or extra low-K dielectric material, one or more other suitable dielectric materials, or a combination thereof. The dielectric layer 402 may be deposited using a CVD process, an ALD process, a PVD process, one or more other applicable processes, or a combination thereof. In some embodiments, the material used to form the dielectric layer 402 is the same material as the material used to form the dielectric layer 204. In some embodiments, the thickness of the dielectric layer 402 may be greater than about 1400 Angstroms. For example, in one case, the thickness of the dielectric layer 402 may be about 1410 Angstroms. In various embodiments, the thickness of the dielectric layer 402 may be chosen to provide enough protection for, and space to form, the resistive element 216A and to provide enough separation (e.g., to avoid crosstalk) between metal lines in adjacent levels of metal within the multilayer metal interconnect structure. For example, in some embodiments, a distance between a given metal interconnect level 'Mx' and a vertically adjacent metal interconnect level 'Mx+1' may be equal to at least about 1500 Angstroms.

The method proceeds to block 114 where an anti-reflective coating and barrier layer are deposited. With reference to the example of FIG. 4, in an embodiment of block 114, an anti-reflective coating (ARC) 404 is deposited over the dielectric layer 402, and a barrier layer 406 is deposited over the ARC 404. In some embodiments, the ARC 404 includes SiN, SiON, SiOC, SiCN, SiOCN, another suitable material, or a combination thereof. The ARC 404 may be deposited using a CVD process, an ALD process, a PVD process, one or more other applicable processes, or a combination thereof. In some embodiments, the barrier layer 406 includes TiN, TaN, a nitrogen-containing layer, another suitable material, or a combination thereof. The barrier layer 406 may be deposited using a CVD process, an ALD process, a PVD process, one or more other applicable processes, or a combination thereof. In some embodiments, the thickness of the ARC 404 is in a range between about 270-330 Angstroms (e.g., such as about 300 Angstroms). The thickness of the barrier layer 406 may, in some examples, be greater than the thickness of the ARC 404. For example, in some embodiments, the thickness of the barrier layer may be in a range between about 340-420 Angstroms (e.g., such as about 380 Angstroms). It is also noted that due to the presence of the patterned dielectric layer 220A, the patterned second barrier layer 218A, and the resistive element 216A in the resistor region 207, the dielectric layer 402, the ARC 404, and the barrier layer 406 may include a raised section 408 within the resistor region 207 that generally follows the underlying surface contours.

The method proceeds to block 116 where trenches for conductive lines and conductive vias are formed. In some embodiments, the trenches for the conductive lines and vias may be formed using a suitable combination of photolithography and etching processes (e.g., wet etching, dry etching, or a combination thereof). With reference to the example of FIGS. 4 and 5, in an embodiment of block 116, a trench formed in the logic region 205 includes a conductive line trench portion 502 and a conductive via trench portion 504, a first trench formed in the resistor region 207 includes a conductive line trench portion 506 and a conductive via trench portion 508, and a second trench formed in the resistor region 207 includes a conductive line trench portion 510 and a conductive via trench portion 512.

In some embodiments, the conductive line trench portions 502, 506, 510 may initially be formed by etching through portions of barrier layer 406, the ARC 404, and the dielectric layer 402. By way of example, the conductive line trench portions 502, 506, 510 have a first width 'W1' and a first height 'H1'. In some examples, and because of the raised section 408 within the resistor region 207, the conductive line trench portions 506, 510 may be offset by a vertical distance 'Z' with respect to the conductive line trench portion 502. After forming the conductive line trench portions 502, 506, 510, and in some embodiments, the conductive via trench portions 504, 508, 512 may be formed. For example, the conductive via trench portion 504 is formed by etching through another portion of the dielectric layer 402, as well as through portions of the dielectric layer 214 and the first barrier layer 212 to expose a top surface of the conductive feature 206. The conductive via trench portions 508, 512 are formed by etching through another portion of the dielectric layer 402, as well as through portions of the patterned dielectric layer 220A, the patterned second barrier layer 218A, the resistive element 216A, the dielectric layer 214 and the first barrier layer 212 to expose top surfaces of the PSLs 208, 210. It is noted that formation of the conductive via trench portions 508, 512 also exposes sidewall surfaces of the resistive element 216A.

Thus, the PSLs 208, 210 may effectively serve as etch stop layers during the etching process used to form the conductive via trench portions 508, 512. In various embodiments, the material used for the PSLs 208, 210 (e.g., such as aluminum, copper, etc.) may have a different (e.g., lower) etch rate than one or more layers formed above the PSLs 208, 210 (e.g., such as the dielectric layer 214, the first barrier layer 212, and/or other layers disposed over the PSLs 208, 210) to thereby provide the etch stop functionality of the PSLs 208, 210. It is noted that etching through the various layers to form the conductive line trench portions and the conductive via trench portions may equivalently be referred to as "punching through" the various layers. As such, the etch stop functionality of the PSLs 208, 210 may be equivalently referred to as a punch stop functionality. In contrast to at least some existing implementations where a conductive via terminates at some uncertain and varying position within the resistive element, by having the conductive via trench portions 508, 512 punching entirely through the resistive element and stopping on an underlying PSLs 208, 210, the via recess depth variation issue may be ignored, while simultaneously improving resistor uniformity. It is also noted that the conductive via trench portions 504, 508, 512 have a second width 'W2'. In some cases, the second width 'W2' is less than the first width 'W1'. In some embodiments, the conductive via trench portion 504 has a second height 'H2' and the conductive via trench portions 508, 512 have a third height 'H3', where the third height 'H3' is greater than the second height 'H2'.

The method proceeds to block 118 where a metal deposition process is performed. With reference to the example of FIGS. 5 and 6, in an embodiment of block 118, a metal layer 602 is deposited over the device 200 and into each of the conductive line trench portions 502, 506, 510 and the conductive via trench portions 504, 508, 512 formed at block 116. The deposited metal layer 602 thus contacts the exposed top surface of the conductive feature 206, the exposed sidewall surfaces of the resistive element 216A (providing contact to the resistive element 216A), and the exposed top surfaces of the PSLs 208, 210. In some embodiments, the metal layer 602 includes copper. In some cases, the metal layer 602 includes another conductive material such as aluminum, cobalt, tungsten, titanium, nickel, gold, platinum, silicide, another suitable conductive material, or a combination thereof. In some examples, the metal layer 602 may be deposited by electrochemical deposition or electrochemical plating (e.g., electroplating). Alternatively, the metal layer 602 may be deposited using a CVD process, an ALD process, a PVD process, an electroless plating process, one or more other applicable processes, or a combination thereof. In some cases, the material used for the metal layer 602 may be the same as the material used for one or both of the conductive feature 206 and the PSLs 208, 210. Alternatively, the material used for the metal layer 602 may be different than the material used for the conductive feature 206 and the PSLs 208, 210.

In some embodiments, a barrier layer may also be formed between the metal layer 602 and sidewall/bottom surfaces of the conductive line trench portions 502, 506, 510 and the conductive via trench portions 504, 508, 512, to prevent diffusion of the metal layer 602. For example, the barrier layer may be deposited on sidewall and bottom surfaces of the conductive line trench portions 502, 506, 510 and the conductive via trench portions 504, 508, 512 prior to deposition of the metal layer 602. Such a barrier layer, if present, may include tantalum nitride, titanium nitride, one or more other suitable materials, or a combination thereof.

The method proceeds to block 120 where a planarization process is performed. With reference to the example of FIGS. 6 and 7, in an embodiment of block 120, a CMP process (planarization process) may be performed to remove excess portions of the metal layer 602 from outside of the trenches (the conductive line trench portions 502, 506, 510 and the conductive via trench portions 504, 508, 512) and planarize a top surface of the device 200. The CMP process may also remove remaining portions of the ARC 404 and the barrier layer 406, while exposing top surfaces of the dielectric layer 402. In particular, deposition of the metal layer 602 and the subsequent CMP process serves to form a conductive line 702 coupled to a conductive via 704, a conductive line 706 coupled to a conductive via 708, and a conductive line 710 coupled to a conductive via 712. In various embodiments, a first electrical connection is provided to the resistive element 216A by way of the conductive line 706 and the conductive via 708, and a second electrical connection is provided to the resistive element 216A by way of the conductive line 710 and the conductive via 712. In addition, a separate electrical connection is provided to the conductive feature 206 by way of the conductive line 702 and the conductive via 704. After the CMP process, top surfaces of the conductive lines 702, 706, 710 and a top surface of the dielectric layer 402 may be substantially coplanar. In various embodiments, the conductive feature 206 may be formed within a metal interconnect level 'Mx', and the conductive lines 702, 706, 710 may be formed in a vertically adjacent metal interconnect level 'Mx+1'. In addition, the PSLs 208, 210 may be formed within the same metal interconnect level 'Mx' as the conductive feature 206.

It is also noted that the resistive element 216A may be electrically connected to adjacent metal lines and/or vias to activate (e.g., to include as part of an active circuit) the resistive element 216A. For example, a first end of the resistive element 216A may be connected to the conductive feature 206 (in the metal interconnect level 'Mx') by way of the conductive line 706 and the conductive via 708 coupled to the first end of the resistive element 216A, the conductive line 702 and the conductive via 704 coupled to the conductive feature 206, and one or more horizontal and/or vertical interconnect lines coupling the conductive line 706 to the conductive line 702. Similarly, a second end of the resistive element 216A may be connected to another conductive feature (in the metal interconnect level 'Mx') by way of the conductive line 710 and the conductive via 712 coupled to the second end of the resistive element 216A, a conductive line and conductive via coupled to the another conductive feature, and one or more horizontal and/or vertical interconnect lines coupling the conductive line 710 to the conductive line connected to the another conductive feature.

The semiconductor device 200 may undergo further processing to form various features and regions known in the art. For example, subsequent processing may form additional conductive vias, conductive lines, resistive elements, barrier layers, interlayer dielectrics, or other appropriate layers on the substrate 202. In furtherance of the example, the multilayer metal interconnect structure disclosed herein may include vertical interconnects, such as vias or contacts, and horizontal interconnects, such as metal lines. The various interconnection features may employ various conductive materials including copper, tungsten, silicide, or other conductive materials as disclosed above. In one example, a damascene and/or dual damascene process is used to form the disclosed multilayer metal interconnect structure. Moreover, additional process steps may be implemented before, during, and after the method 100, and some process steps described above may be replaced or eliminated in accordance with various embodiments of the method 100. Further, while the method 100 has been shown and described as including a single resistive element, it will be understood that other device configurations are possible. In some embodiments, the method 100 may be used to fabricate a device 200 including a plurality of resistive elements.

Figure 7:
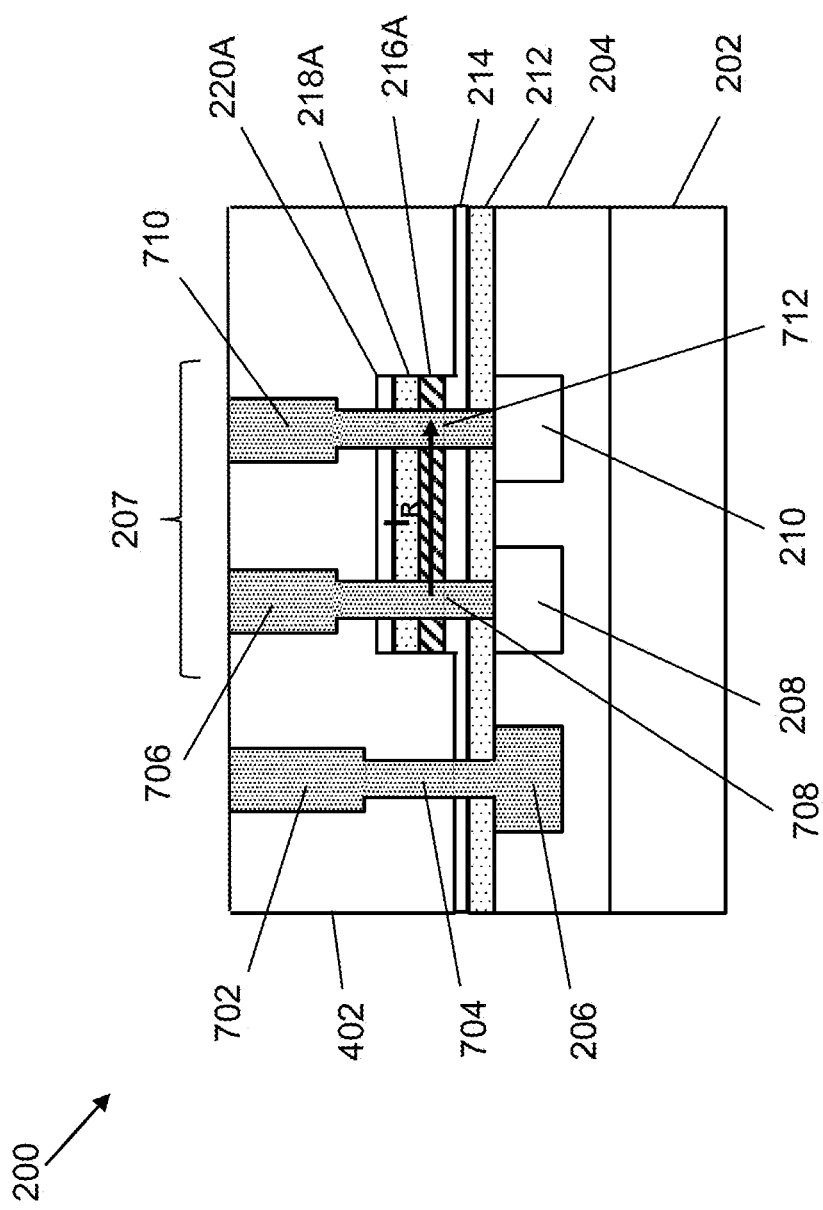
Figure 8:
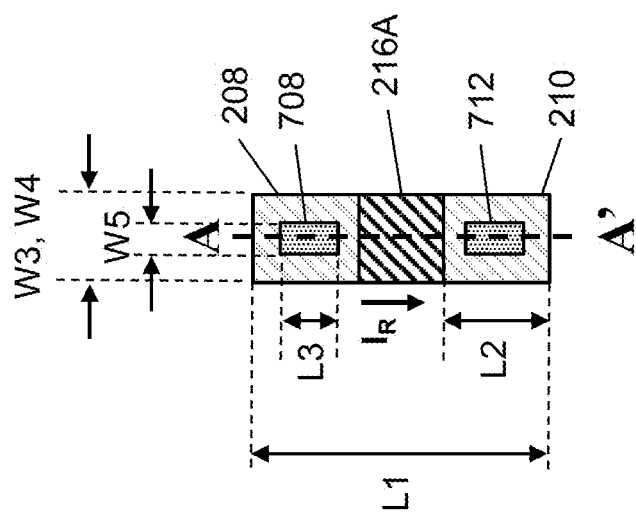
FIG. 8 is a top-view of a resistor region of the semiconductor device 200, in accordance with some embodiments.

With reference now to FIG. 8, illustrated therein is a top-view of the resistor region 207 of the device 200, as shown in FIG. 7. In addition, the cross-section view of the resistor region 207 shown in FIG. 7 corresponds to the section A-A' of FIG. 8. For clarity of discussion, some layers have been omitted from the top-view of the resistor region 207. In particular, the top-view of the resistor region 207 illustrates the resistive element 216A, the PSLs 208, 210, the conductive via 708, and the conductive via 712. Each of the PSLs 208, 210, as shown in the top-view of FIG. 8, may have three side edges that are substantially aligned with three underlying side edges of the resistive element 216A. As noted above, each of the conductive vias 708, 712 provide electrical contact to the resistive element 216A. It is also noted that the top-view shape/area of the resistive element 216A, for example as illustrated in FIG. 8, may be defined during patterning process of block 110, described above. In general, as the top view area of the resistive element increases, the resistance value of the resistive element increases. By way of example, FIGS. 7 and 8 also illustrate an exemplary current flow '$I_R$' direction that passes from the conductive lines/vias and through the resistive element 216A during operation of the device 200.

In some embodiments, the top view area of the resistive element 216A 'W3×L1' may be in a range from about 0.1 micron×0.1 micron to about 2 microns×24 microns. Additionally, a number of conductive vias (e.g., such as the conductive vias 708, 712) used to contact the resistive element 216A at each end of the resistive element 216A, and an area of each of the conductive vias 'W5×L3', will depend on the dimensions (e.g., top view area) of the resistive element 216A. As one example, the conductive via length 'L3' may be equal to less than half of the length 'L1' of the resistive element 216A. Thus, in some embodiments, the conductive via length 'L3' may be in a range of less than about 0.05 microns to less than about 12 microns. Similarly, an area of each of the PSLs 208, 210 'W4×L2' will depend on the dimensions (e.g., top view area) of the resistive element 216A. In an example, the width 'W4' of the PSLs 208, 210 may be substantially the same as the width 'W3' of the resistive element 216A, and the length 'L2' of the PSLs 208, 210 may also be equal to less than half of the length 'L1' of the resistive element 216A, while being greater than the conductive via length 'L3'. Thus, in some embodiments, the length 'L2' of the PSLs 208, 210 may be in a range of less than about 0.05 microns to less than about 12 microns. In various cases, the width 'W5', length 'L3', and number of conductive vias contacting the resistive element 216A, at either end of the resistive element 216A, may be selected to provide sufficient overlap (e.g., as seen in the top view) of the PSLs 208, 210 to the conductive vias and thereby ensure that the conductive vias land on the PSLs 208, 210 with sufficient margin between an edge of the conductive vias and an edge of the PSLs 208, 210.

Figure 9:
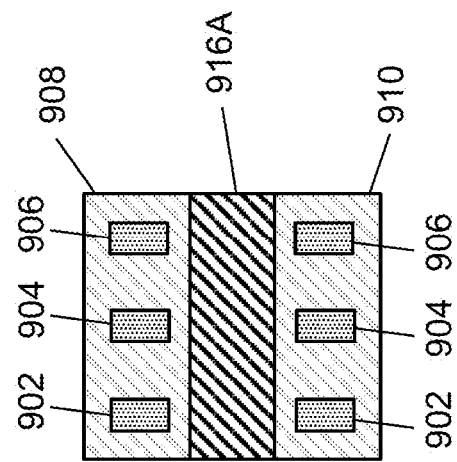
FIG. 9 is a top-view of a resistor region of a semiconductor device including a plurality of conductive vias at each end of a resistive element, in accordance with some embodiments.

Further, while the example of FIG. 8 illustrates two vias (conductive vias 708, 712) in contact with the resistive element 216A (e.g., one at each end of the resistive element 216A), more vias may be used. For instance, for a resistive element having a larger top-view shape/area, a greater number of vias may be in contact with the resistive element (e.g., at each end of the resistive element). As merely one example, and with reference to the example of FIG. 9, an array of three (3) vias (conductive vias 902, 904, 906) may be formed in contact with each end of a resistive element 916A, where each of the plurality of conductive vias 902, 904, 906 stops on and is in contact with underlying punch stop layers 908, 910. In some cases, the number of conductive vias that are formed in contact with each end of resistive element may be between about 1 conductive via and 15 conductive vias. It is also noted that as the top-view area of a resistive element increases and/or as the number of conductive vias contacting the resistive element increases, the top-view area of the PSLs may also increase accordingly.

The exemplary top-views of the resistor region 207, as shown and discussed above with reference to FIGS. 8 and 9, are not meant to be limiting, and other shapes and/or relative sizes of the various elements depicted therein may equally be used without departing from the scope of the present disclosure. For example, with reference to FIGS. 10-13, illustrated therein are top-views of the resistor region 207 where the PSLs 208, 210 are differently sized with respect to the conductive vias 708, 712 and the resistive element 216A (e.g., as compared to the embodiment of FIG. 8). In the example of FIG. 10, the width 'W4' and the length 'L2' of the PSLs 208, 210 may be increased (e.g., as compared to FIG. 8) such that none of the side edges are aligned with the underlying side edges of the resistive element 216A. In this example, the width 'W4' of the PSLs 208, 210 is greater than the width 'W3' of the resistive element 216A, and the length 'L2' of the PSLs 208, 210 has been increased such that the PSLs 208, 210 overlap an end of the resistive element 216A by a dimension 'D1'. In some examples, the dimension 'D1' is substantially equal to the difference between the width 'W4' and the width 'W3'. In the example of FIG. 11, the width 'W4' of the PSLs 208, 210 has been increased (e.g., as compared to FIG. 8) such that one side edge of each of the PSLs 208, 210 is aligned with an underlying side edge of the resistive element 216A (while lateral side edges of the PSLs 208, 210 are not aligned with the side edges of the resistive element 216A). In this example, the width 'W4' of the PSLs 208, 210 is greater than the width 'W3' of the resistive element 216A. In the example of FIG. 12, the width 'W4' and the length 'L2' of the PSLs 208, 210 may be decreased (e.g., as compared to FIG. 8) such that none of the side edges are aligned with the underlying side edges of the resistive element 216A. In this example, the width 'W4' of the PSLs 208, 210 is less than the width 'W3' of the resistive element 216A, and the length 'L2' of the PSLs 208, 210 has been decreased such that the PSLs 208, 210 underlap an end of the resistive element 216A by a dimension 'D2'. In some examples, the dimension 'D2' is substantially equal to the difference between the width 'W4' and the width 'W3'. In the example of FIG. 13, the width 'W4' of the PSLs 208, 210 has been decreased (e.g., as compared to FIG. 8) such that one side edge of each of the PSLs 208, 210 is aligned with an underlying side edge of the resistive element 216A (while lateral side edges of the PSLs 208, 210 are not aligned with the side edges of the resistive element 216A). In this example, the width 'W4' of the PSLs 208, 210 is less than the width 'W3' of the resistive element 216A.

Referring to FIGS. 14-15, illustrated therein are top-views of the resistor region 207 where the resistive element 216A has a different shape (e.g., as compared to the embodiment of FIG. 8). In the example of FIG. 14, the resistive element 216A has a serpentine pattern. In some embodiments, and for a resistor region 207 having a fixed area, a serpentine pattern resistor may provide a greater resistance than a linear resistor (e.g., such as shown in FIG. 8). In the example of FIG. 15, the resistive element 216A has an L-shaped pattern. It is noted that in some cases, the electrical performance (e.g., resistance value) of resistors having bends, such as the serpentine pattern resistor of FIG. 14 or the L-shaped pattern resistor of FIG. 15, may be difficult to control because of the current crowding effect occurring at bends in the resistive element 216. Further, it will be understood that in some cases, the various linear segments of the serpentine or L-shaped pattern resistors may have different dimensions (e.g., such as a segment length) or the same dimensions, and adjacent segments (e.g. of the serpentine pattern resistor) may be aligned or unaligned.

Figure 18:
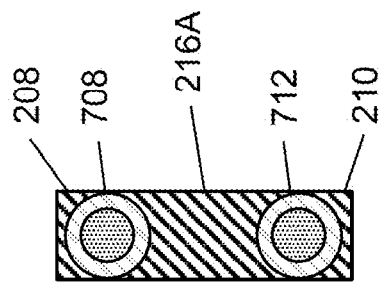
FIGS. 16, 17, and 18 are top-views of a resistor region of a semiconductor device with alternative PSL and conductive via geometries, according to some embodiments.
Figure 17:
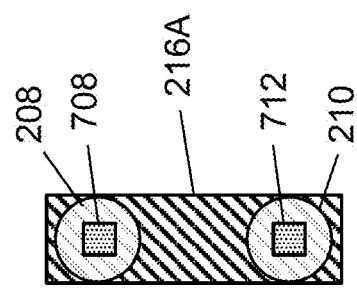
Figure 16:
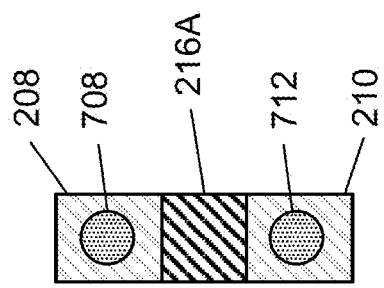

With reference to FIGS. 16-18, illustrated therein are top-views of the resistor region 207 where the PSLs 208, 210 and/or the conductive vias 708, 712 have a round/oval shape (e.g., in contrast to the embodiment of FIG. 8, where the PSLs 208, 210 and the conductive vias 708, 712 have square/rectangular shapes). In the example of FIG. 16, the conductive vias 708, 712 have a round/oval shape while the PSLs 208, 210 have a square/rectangular shape. In the example of FIG. 17, the conductive vias 708, 712 have a square/rectangular shape while the PSLs 208, 210 have a round/oval shape. In the example of FIG. 18, both the conductive vias 708, 712 and the PSLs 208, 210 have a round/oval shape. In some embodiments, for example when the PSLs 208, 210 have a round/oval shape, edges of the PSLs 208, 210 may overlap or underlap edges of the resistive element 216 (e.g., similar to the example of FIGS. 10-13). Further, in some examples when the PSLs 208, 210 have a round/oval shape, a diameter of the PSLs 208, 210 may be substantially the same as the width 'W3' of the resistive element 216A, discussed above.

With respect to the description provided herein, disclosed is a structure and related method of forming a semiconductor device including a resistive element with enhanced uniformity. To address the recess depth variation issue present in some existing implementations, embodiments of the present disclosure provide PSLs disposed beneath a resistive element and directly beneath a conductive via that is used to contact the resistive element. In various embodiments, the conductive via punches through the resistive element (and one or more other layers) and stops on the PSLs. Thus, rather than having the conductive via terminate at some uncertain and varying position within the resistive element, the conductive vias which contact the resistive elements may pass entirely through the respective resistive element to which they are in contact and stop on an underlying PSL. As a result, the via recess depth variation issue may be ignored, while simultaneously improving the resistor uniformity, especially for highly scaled resistor dimensions. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method including forming a conductive feature and a first punch stop layer, where the conductive feature has a first top surface, and where the first punch stop layer has a second top surface that is substantially level with the first top surface. The method further includes forming a resistive element over the first punch stop layer. The method further includes etching through a first portion of the resistive element to form a first trench that exposes both the second top surface of the first punch stop layer and a first sidewall surface of the resistive element. The method further includes forming a first conductive via within the first trench, where the first conductive via contacts the first sidewall surface of the resistive element.

In another of the embodiments, discussed is a method including forming a first punch stop layer and a second punch stop layer within a first dielectric layer disposed over a substrate, where the first and second punch stop layers are substantially level with each other. The method further includes depositing a plurality of layers over the first and second punch stop layers, the plurality of layers including a resistive layer. The method further includes forming a first trench that exposes the first punch stop layer and a second trench that exposes the second punch stop layer. The method further includes forming a first conductive via within the first trench and a second conductive via within the second trench, where the first conductive via contacts a first region of the resistive layer, and where the second conductive via contacts a second region of the resistive layer.

In yet another of the embodiments, discussed is a semiconductor device including a first metal line and a first punch stop layer having a first top surface that is substantially level with a second top surface of the first metal line. The semiconductor device further includes a resistive element disposed over the first punch stop layer, and a first conductive via in contact with both the first top surface of the first punch stop layer and first sidewall surfaces of the resistive element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first metal line;
a first punch stop layer having a first top surface that is substantially level with a second top surface of the first metal line;
a resistive element disposed over the first punch stop layer;
a first conductive via in contact with both the first top surface of the first punch stop layer and first sidewall surfaces of the resistive element; and
a third conductive via in contact with the second top surface of the first metal line, wherein a first top edge of the first conductive via is offset from a second top edge of the third conductive via.

2. The semiconductor device of claim 1, wherein the first punch stop layer includes Al, Cu, or a combination thereof.

3. The semiconductor device of claim 1, further comprising:
a second metal line in contact with the first conductive via, wherein the second metal line is disposed in a metal interconnect level above the first metal line.

4. The semiconductor device of claim 3, wherein the first conductive via has a first width, and wherein the second metal line has a second width greater than the first width.

5. The semiconductor device of claim 1, further comprising:
a second punch stop layer having a third top surface that is substantially level with the first and second top surfaces, wherein the first and second punch stop layers are disposed beneath opposite ends of the resistive element; and
a second conductive via in contact with both the third top surface of the second punch stop layer and second sidewall surfaces of the resistive element.

6. The semiconductor device of claim 1, wherein the first metal line is formed within a logic region of the semiconductor device, and wherein the first punch stop layer is formed within a resistor region of the semiconductor device.

7. The semiconductor device of claim 1, wherein the first metal line provides a portion of a multilayer metal interconnect structure.

8. The semiconductor device of claim 7, wherein the first metal line and the first punch stop layer are formed within a same metal interconnect level of the multilayer metal interconnect structure.

9. A semiconductor device, comprising:
a first punch stop layer and a second punch stop layer disposed within a dielectric layer, wherein top surfaces of the first punch stop layer, the second punch stop layer, and the dielectric layer are level;
a resistive element disposed over the first punch stop layer and the second punch stop layer, wherein a width of the resistive element is substantially uniform across an entire length of the resistive element;
a first conductive via in contact with a first end of the resistive element and a second conductive via in contact with a second end of the resistive element;
a conductive feature having a top surface that is substantially level with the top surface of the first punch stop layer; and
a third conductive via in contact with the conductive feature, wherein top edges of the first and second conductive vias are offset from a top edge of the third conductive via.

10. The semiconductor device of claim 9,
wherein the top surface of the conductive feature is further substantially level with the top surfaces of the second punch stop layer and the dielectric layer.

11. The semiconductor device of claim 9, wherein the conductive feature, the first punch stop layer, and the second punch stop layer are formed within a same metal interconnect level of a multilayer metal interconnect structure.

12. The semiconductor device of claim 9, wherein the conductive feature is formed in a first substrate region, and wherein the first punch stop layer and the second punch stop layer are formed in a second substrate region adjacent to the first substrate region.

13. The semiconductor device of claim 12, wherein the first substrate region includes a logic region, and wherein the second substrate region includes a resistor region.

14. A semiconductor device, comprising:
a conductive feature and a punch stop layer formed within a same metal interconnect level of a multilayer metal interconnect structure;
a resistive element disposed over the punch stop layer;
a first conductive via in contact with the resistive element and a first conductive line formed over and in contact with the first conductive via; and
a second conductive via in contact with the conductive feature and a second conductive line formed over and in contact with the second conductive via;
wherein a first bottom edge of the first conductive line is offset from a second bottom edge of the second conductive line.

15. The semiconductor device of claim 14, wherein a first top surface of the punch stop layer is substantially level with a second top surface of the conductive feature.

16. The semiconductor device of claim 14, wherein the first conductive via and the second conductive via have a first width, and wherein the first conductive line and the second conductive line have a second width greater than the first width.

17. The semiconductor device of claim 14, further including another punch stop layer formed within the same metal interconnect level of the multilayer metal interconnect structure, wherein the resistive element is further disposed over the another punch stop layer, and wherein the first conductive via and a third conductive via contact the resistive element at opposing ends of the resistive element.

18. The semiconductor device of claim 14, further including a third conductive via in contact with the resistive element and a third conductive line formed over and in contact with the third conductive via.

19. The semiconductor device of claim 18, wherein a third bottom edge of the third conductive line is offset from the second bottom edge of the second conductive line.

20. The semiconductor device of claim 18, wherein a third bottom edge of the third conductive line is level with the first bottom edge of the first conductive line.

\* \* \* \* \*